(12) United States Patent
Ping

(10) Patent No.: US 6,881,652 B2
(45) Date of Patent: *Apr. 19, 2005

(54) METHOD TO FABRICATE AN INTRINSIC POLYCRYSTALLINE SILICON FILM

(75) Inventor: Er-Xuan Ping, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/778,440

(22) Filed: Feb. 13, 2004

(65) Prior Publication Data

US 2004/0161912 A1 Aug. 19, 2004

Related U.S. Application Data

(62) Division of application No. 10/133,029, filed on Apr. 26, 2002, now Pat. No. 6,703,268, which is a continuation of application No. 09/777,375, filed on Feb. 5, 2001, now Pat. No. 6,383,851, which is a division of application No. 09/389,656, filed on Sep. 2, 1999, now Pat. No. 6,204,156.

(51) Int. Cl.⁷ .......................... H01L 21/20; H01L 21/00
(52) U.S. Cl. ...................................... 438/486; 438/166
(58) Field of Search ................................ 438/486, 482, 438/488, 166; 257/75

(56) References Cited

U.S. PATENT DOCUMENTS

| | | | |
|---|---|---|---|
| 5,418,180 A | | 5/1995 | Brown |
| 5,486,237 A | * | 1/1996 | Sano et al. ............... 136/258 |
| 5,529,937 A | | 6/1996 | Zhang et al. |
| 5,621,224 A | * | 4/1997 | Yamazaki et al. ............ 257/66 |
| 5,721,171 A | | 2/1998 | Ping et al. .................. 438/398 |
| 5,893,747 A | * | 4/1999 | Yang .......................... 438/592 |
| 6,013,555 A | | 1/2000 | Yew et al. .................. 438/398 |
| 6,046,083 A | | 4/2000 | Lin et al. .................... 438/255 |
| 6,049,106 A | | 4/2000 | Forbes ....................... 257/329 |
| 6,069,053 A | | 5/2000 | Ping et al. .................. 438/398 |
| 6,204,156 B1 | | 3/2001 | Ping .......................... 438/488 |
| 6,383,851 B1 | * | 5/2002 | Ping .......................... 438/166 |

OTHER PUBLICATIONS

Singh et al., "Novel Method for the Formation of a Large Grained, Silicon Thin Films on Amorphous Surface", J. Electrochem. Soc., vol. 145, No. 11, pp. 3963–6, 1998.

* cited by examiner

Primary Examiner—Matthew Smith
Assistant Examiner—Lex H. Malsawma

(57) ABSTRACT

A thin film transistor using an intrinsic polycrystalline silicon film, the thin film transistor fabricated by forming an insulation layer on a substrate, forming a first amorphous silicon layer on the insulation layer, forming silicon nucleation sites on the first amorphous silicon layer; converting the first amorphous silicon layer into hemispherical grained silicon, forming a second amorphous silicon layer covering the hemispherical grained silicon, annealing the second amorphous silicon layer to convert the second amorphous silicon layer into a grained silicon film, patterning an oxide layer into a transistor gate oxide and leaving uncovered sections of the grained silicon on opposing sides of the transistor gate oxide, conductively doping the uncovered sections of the grained silicon and forming a patterned metal gate on the transistor gate oxide.

18 Claims, 2 Drawing Sheets

METHOD TO FABRICATE AN INTRINSIC POLYCRYSTALLINE SILICON FILM

This application is a divisional to U.S. patent application Ser. No. 10/133,029, filed Apr. 26, 2002, now U.S. Pat. No. 6,703,268, which is a continuation to U.S. Pat. No. Application 09/777,375, filed Feb. 5, 2001, now U.S. Pat. No. 6,383,851, which is a divisional to U.S. patent application Ser. No. 09/389,656, filed Sep. 2, 1999 now U.S. Pat. No. 6,204,156.

FIELD OF THE INVENTION

This invention relates to semiconductor fabrication processing and more particularly to a method for forming large grain polysilicon films for semiconductor structures, such as thin film transistors used in random access memories.

BACKGROUND OF THE INVENTION

In current technology to fabricate thin film field effect transistors, an intrinsic silicon film, ideally having high charge carrier mobility, is needed for the transistor channel. The conventional approach to obtain such a film is to anneal an amorphous silicon film either by rapid thermal annealing step or by low temperature furnace annealing, which requires considerable processing time. The resultant film has a large grain size and therefore the acceptable carrier mobility needed for the device. However, this approach requires a high temperature process in the case of rapid thermal anneal or long processing time in the case of furnace anneal. The high temperature should be avoided in most thin film transistor fabrication because of the extensive use of metal electrodes. The long processing time is not desired due to the slow through put required for each wafer to be processed.

A major problem that must be overcome is that the thin film transistor is formed after the metal lines of the memory device have been fabricated. Once metal lines are formed, the subsequent fabrication steps that follow must stay below the re-flow temperature, or melting point, of the metal used. The present invention discloses a method to form very-large grain silicon as a way to increase charge carrier mobility of a thin film transistor pullup device, while avoiding high temperatures and long annealing times.

SUMMARY OF THE INVENTION

Exemplary implementations of the present invention comprise processes for forming a large grain silicon film for use in a semiconductor assembly. The process first forms hemispherical grain (HSG) silicon over a semiconductor assembly substrate by deposition of HSG silicon directly, or by converting an amorphous silicon layer seeded with silicon nucleation sites into HSG silicon by annealing. Next, an amorphous silicon layer is formed directly on the hemispherical silicon grain surface. Next, an anneal step is performed to cause the amorphous silicon layer to convert into large silicon grains that use the hemispherical grain silicon as a base.

DETAILED DESCRIPTION OF THE INVENTION

Figure 2A:
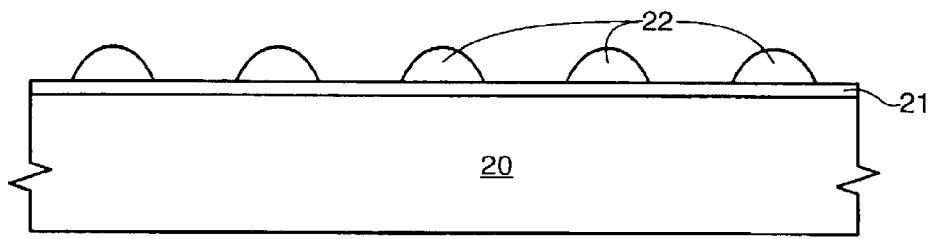
FIG. 2A is a cross-sectional view depicting a semiconductor substrate after the deposition of HSG silicon on an insulation layer.
Figure 2B:
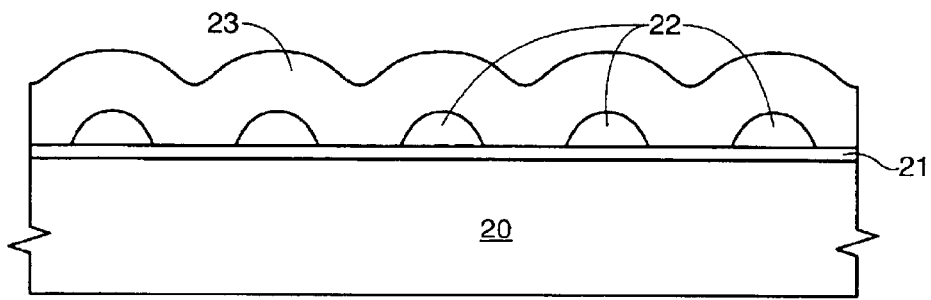
FIG. 2B is a cross-sectional view of the structure of FIG. 2A taken after the formation of an amorphous silicon film over the HSG silicon.
Figure 2C:
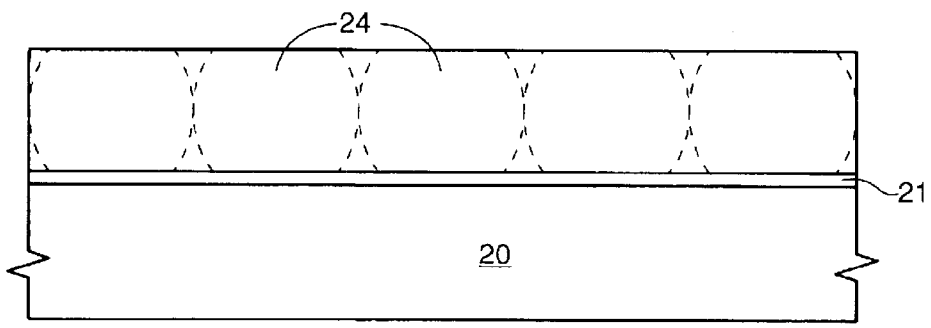
FIG. 2C is a cross-sectional view of the structure of FIG. 2B taken after an annealing step to form a large grain silicon film.
Figure 3:
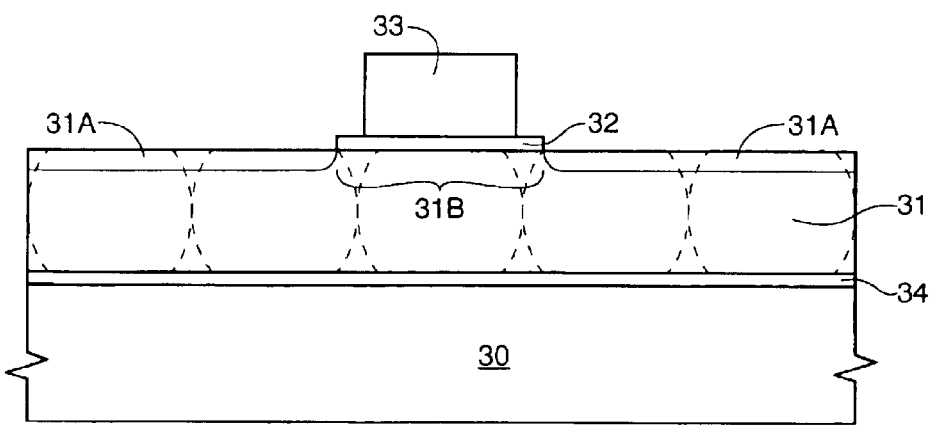
FIG. 3 is a cross-sectional view of the structures of either FIG. 1D or FIG. 2C taken after the formation of a transistor gate oxide, doping of the grain silicon film to form the transistor's source/drain terminals and finally the formation of a transistor gate.

Exemplary implementations of the present invention directed to processes for forming a large grain silicon film, which may be used to develop a thin film transistor in a semiconductor device, are depicted in FIGS. 1–3.

Figure 1A:
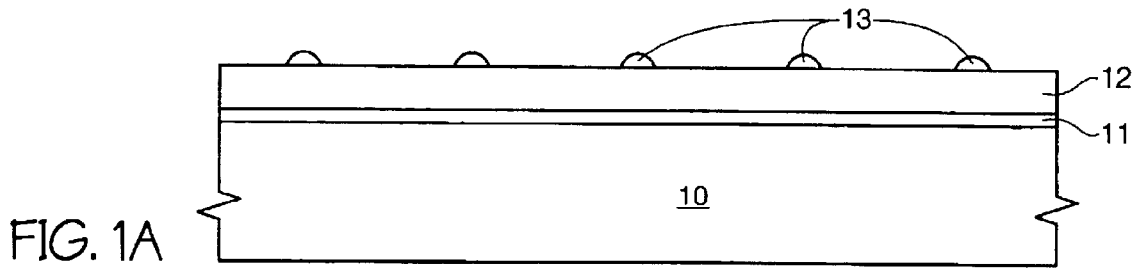
FIG. 1A is a cross-sectional view depicting a semiconductor substrate after the formation of a first amorphous silicon film, followed by the deposition of silicon nucleation sites.

A first exemplary implementation of the present invention is depicted in FIGS. 1A–1D. Referring to FIG. 1A, substrate 10 comprising a semiconductive material, such as a silicon wafer, is prepared for the processing steps of the present invention. During preparation, an insulation layer 11, overlying substrate 10 is formed to isolate a subsequently formed thin film transistor (TFT) from substrate 10. Next, an amorphous silicon layer 12 is formed over the top of insulation layer 11. Amorphous silicon layer 12 is formed with conventional fabrication techniques using deposition temperatures ranging from 500° C. to 550° C. For example, an amorphous silicon layer having a thickness of approximately 300 angstroms can be deposited by presenting a silicon-based gas and nitrogen to the semiconductor assembly for time of 30 minutes at the temperature range above. At 500° C. to 550° C. and with a silicon to nitrogen ratio of 10:1 or 20:1, amorphous silicon is deposited at a rate of 10 angtroms/minute. After amorphous silicon layer 12 is formed, silicon nucleation sites 13 are formed on top of amorphous silicon layer 12.

Silicon nucleation sites 13 can also be formed by conventional fabrication techniques. For example, one method is to deposit silicon at a temperature of 550° C. to 650° C., using a silicon-based gas (such as $SiH_4$, $SiH_6$, etc.) in combination with an inert gas (such as $N_2$, $He_2$, etc.), which results in the formation of silicon nucleation sites 13. Though silicon nucleation sites 13 appear uniform in size and in distribution, (in the cross-section of FIG. 1A) the representation of the silicon nucleation sites in FIG. 1A is not intended to indicate that the resulting silicon nucleation will necessarily result in such a pattern or size. The actual silicon nucleation sites 13 may vary in size and be distributed in a more random fashion than as depicted. However, to gain the desired large grain silicon of the present invention, it is desired that silicon nucleation sites 13 be approximately 200 angstroms or less in size and separated from one another by approximately 0.1 micron to 0.5 microns. The development of silicon nucleation sites 13 and the spaces between them are controlled by the length of time the silicon-based gas is allowed to develop the silicon to nucleate. To gain the desired spacing, the silicon-based gas is presented to the semiconductor assembly for approximately 10 minutes and at the temperature range of 550° C. to 650° C. The reason for these desired dimension requirements will become apparent as the method of the present invention is fully developed.

Figure 1B:
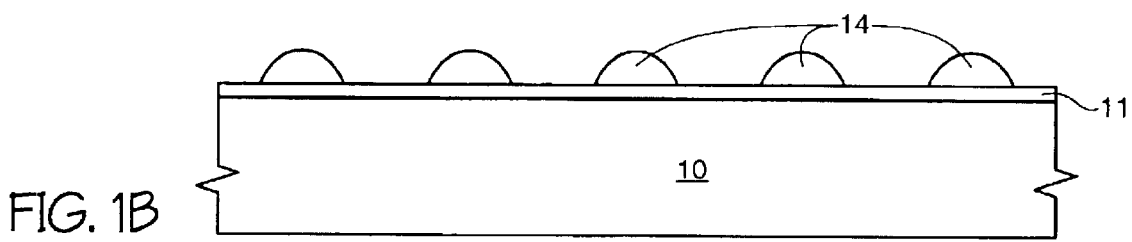
FIG. 1B is a cross-sectional view of the structure of FIG. 1A taken after an annealing step to form a hemispherical grain silicon.

Referring to FIG. 1B, silicon nucleation sites 13 and amorphous silicon layer 12 are subjected to an annealing step at a temperature of 550° C. to 650° C. to convert the amorphous silicon film into HSG silicon layer 14 by using silicon nucleation sites 13 as seeding for grain formation. The annealing step is performed for a period of time that is sufficient to convert the entire amorphous silicon to HSG. For example, to convert a 300 angstroms amorphous silicon layer to HSG at a temperature range of 550° C. to 650° C., the annealing step will need to be conducted for a period of 10 minutes to 20 minutes. The largest grain size that can be obtained by conventional method used to form HSG silicon is 500 angstroms to 1000 angstroms, which is less than 2 to 5 times the desired grain size of the present invention. In order to create the very-large grain size of the present invention addition processing steps are employed.

Figure 1C:
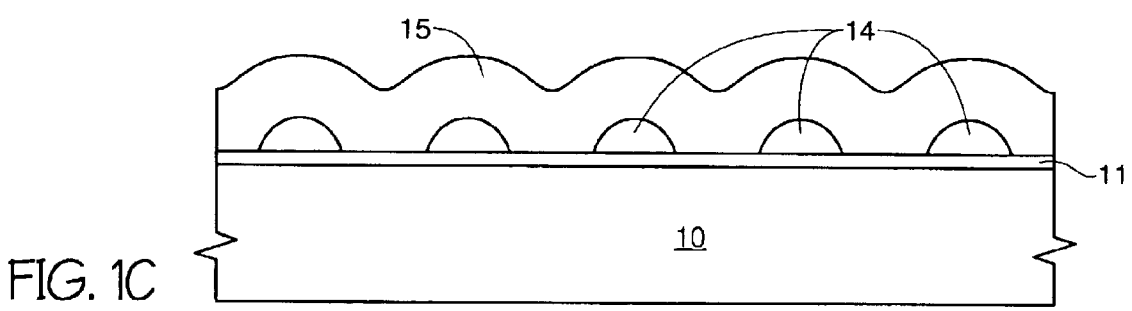
FIG. 1C is a cross-sectional view of the structure of FIG. 1B taken after the formation of a second amorphous silicon film.
Figure 1D:
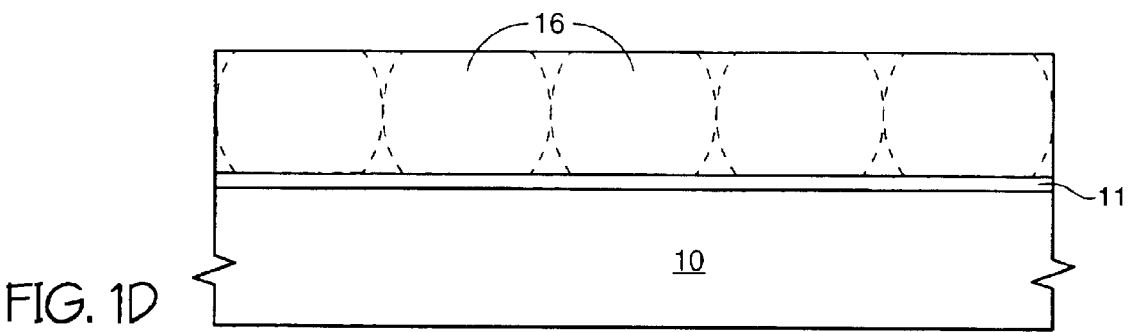
FIG. 1D is a cross-sectional view of the structure of FIG. 1C taken after an annealing step to form a large grain silicon film.

Referring to FIG. 1C, a second amorphous silicon layer 15 is deposited directly on HSG silicon 14. The desired thickness of amorphous silicon layer 15 is 500 angstroms to 1000 angstroms. To obtain the desired thickness of layer 15 a silicon-based gas and nitrogen having a ration of silicon to nitrogen of 20:1, is presented to the semiconductor assembly at a temperature of 500° C. to 550° C. for a time period of 10 minutes to 20 minutes. Amorphous silicon layer 15 will provide the catalyst to form the very-large grain silicon of the present invention. Next, amorphous silicon layer is subjected to an annealing step at a temperature from 550° C. to 580° C. to convert silicon layer 15 into very-large grain silicon layer 16, as shown in FIG. 1D. The annealing step is performed for a period of time that is sufficient to convert the entire amorphous silicon to large grain silicon. For example, to convert a 500 angstroms amorphous silicon layer into large grain silicon at a temperature range of 550° C. to 580° C., the annealing step will need to be conducted for a period of 10 minutes to 20 minutes. It is preferred that this annealing step be performed insitu after the deposition of amorphous silicon layer 15.

The size of the resulting very-large grain silicon is controlled by silicon nucleation sites 13, amorphous layer 15 and the annealing temperature used. The average size of the large grain silicon that can be obtained directly relates to the distance between individual nucleation sites. As taught previously, the desired distance between silicon nucleation sites 13 is between 0.1 to 0.5 microns (1000 angstroms to 5000 angstroms). Thus, the resulting large silicon grain will be between the range of 0.1 to 0.5 microns, an optimum size grain for intrinsic polycrystalline silicon films that may be used to form various devices for a semiconductor assembly, namely a thin film transistor.

A second exemplary implementation of the present invention is depicted in FIGS. 2A–2C. Referring to FIG. 2A, HSG silicon 22 is deposited on insulation layer 21, which resides on substrate 20. HSG silicon 22 can be deposited by creating silicon nucleation sites at a temperature of 550° C. to 650° C., using a silicon-based gas (such as $SiH_4$, $SiH_6$, etc.) in combination with an inert gas (such as $N_2$, $He_2$, etc.). The silicon nucleation is allowed to continue until HSG silicon, having a grain size of approximately 500 angstroms to 1000 angstroms is obtained. Other methods to form HSG silicon, such as HSG formation methods taught in U.S. Pat. No. 5,418,180, U.S. and U.S. Pat. No. 5,721,171, assigned to the assignee of the present application, and are hereby incorporated by reference as if set forth in their entirety. Though HSG silicon 22 appears uniform in size and in distribution, (in the cross-section of FIG. 2A) the representation of the HSG silicon in FIG. 2A is not intended to indicate that the resulting HSG silicon will necessarily result in such a pattern or size. The actual HSG silicon 22 may vary in size and be distributed in a more random fashion than as depicted. However, to gain the desired large grain silicon of the present invention, it is desired that HSG silicon 22 be approximately 500 angstroms to 1000 angstroms and be separated from one another, at each grain center, by approximately 0.1 micron to 0.5 microns, as taught in the first embodiment of the present invention.

Referring to FIG. 2B, an amorphous silicon layer 23 is deposited directly on HSG silicon 22. Amorphous silicon layer 23 will provide the catalyst to form the very-large grain silicon of the present invention. Next, amorphous silicon layer 23 is subjected to an annealing step at a temperature from 550° C. to 580° C. to convert silicon layer 23 into very-large grain silicon 24, as shown in FIG. 2C. It is preferred that this annealing step is performed insitu after the deposition of amorphous silicon layer 23.

The size of the resulting very-large grain silicon is controlled by the size and spacing of HSG silicon 24, amorphous layer 23 and the annealing temperature employed. The desired distance between the centers of HSG silicon 22 is between 0.1 to 0.5 microns. Thus the resulting large silicon grain will be within the range of 0.1 to 0.5 microns across. To obtain the desired layer thickness and grain size, deposition conditions are the same as taught in the first exemplary implementation of the present invention.

Either of the above exemplary implementations of the present invention can be used to fabricate the thin film transistor (TFT) as depicted in FIG. 3. Referring to FIG. 3, gate oxide 32 and metal gate 33 are formed and patterned on very-large grain silicon layer 31. Next, the very-large grain intrinsic silicon layer 31 is conductively doped to form conductive active regions 31A on opposing sides of gate oxide 32, while leaving an intrinsic silicon portion 31B underlying gate oxide 32 that will function as the channel region to the completed TFT. Conductive regions 31A form source and drain regions, intrinsic portion 31B forms a channel region, gate oxide 32 forms a gate insulation layer and metal gate 33 forms a conductive gate which function collectively as a thin film field effect transistor. The intrinsic nature of silicon layer 31 will effectively operate as a channel region without any light conductive doping prior to the formation of the transistor. However, light conductive doping of intrinsic layer 31 prior to forming the gate oxide may be conducted if so desired to obtain certain transistor operating characteristics.

Source and drain regions 31A are available for making connections to other structures required by a given process, such as a process to form dynamic random access memories, static random access memories, or any semiconductor device that could implement the TFT of the present invention. The semiconductor device is then completed in accordance with fabrication processes known to those skilled in the art.

It is to be understood that although the present invention has been described with reference to several preferred embodiments, various modifications, known to those skilled in the art, such as utilizing the disclosed methods to form programmable floating gate devices, may be made to the process steps presented herein without departing from the invention as recited in the several claims appended hereto.

What is claimed is:

1. A process for forming an intrinsic polycrystalline silicon film for a semiconductor assembly, said process comprising the steps of:

forming an insulation layer on a substrate;

forming a first amorphous silicon layer on said insulation layer;

forming silicon nucleation sites on said first amorphous silicon layer;

converting said first amorphous silicon layer into hemispherical grained silicon, said hemispherical grained silicon being formed about said silicon nucleation sites;

forming a second amorphous silicon layer covering said hemispherical grained silicon;

annealing said second amorphous silicon layer to convert said second amorphous silicon layer into a grained silicon film, said grained silicon film being formed about said hemispherical grained silicon.

2. The process as recited in claim 1, wherein said step of forming said hemispherical grained silicon comprises presenting a silicon-based gas to said semiconductor assembly at a temperature of 500° C. to 550° C.

3. The process as recited in claim 2, wherein said silicon-based gas is a gas selected from the group consisting of $SiH_4$ and $SiH_6$.

4. The process as recited in claim 1, wherein said step of forming said second amorphous silicon layer comprises depositing an amorphous silicon layer having a thickness of 500 angstroms at a temperature ranging from 500° C. to 550° C.

5. The process as recited in claim 1, wherein said step of converting said second amorphous silicon layer into a grained silicon film comprises subjecting said second amorphous silicon layer to an annealing step at a temperature ranging from 550° C. to 580° C.

6. The process as recited in claim 1, wherein said silicon nucleation sites are made up of silicon deposits that are approximately 200 angstroms or less in size and are spaced approximately 0.1 microns to 0.5 microns apart.

7. A process for forming a thin film transistor for a semiconductor device, said process comprising the steps of:

forming an insulation layer on a silicon substrate;

forming hemispherical grained silicon on said insulation layer;

forming an amorphous silicon layer covering said hemispherical grained silicon and said insulation layer;

converting said amorphous silicon layer into a grained silicon film, said grained silicon film being formed about said hemispherical grained silicon;

patterning an oxide layer into a transistor gate oxide, thus leaving uncovered sections of said grained silicon film on opposing sides of said transistor gate oxide;

conductively doping said uncovered sections of said grained silicon film;

forming a patterned metal gate on said transistor gate oxide.

8. The process as recited in claim 7, wherein said step of forming said hemispherical grained silicon comprises presenting a silicon-based gas to said semiconductor assembly at a temperature of 500° C. to 550° C.

9. The process as recited in claim 8, wherein said silicon-based gas is a gas selected from the group consisting of $SiH_4$ and $SiH_6$.

10. The process as recited in claim 7, wherein said step of forming said amorphous silicon layer comprises depositing an amorphous silicon layer having a thickness of 300 angstroms at a temperature ranging from 500° C. to 550° C.

11. The process as recited in claim 7, wherein said step of converting said amorphous silicon layer into a grained silicon film comprises subjecting said amorphous silicon layer to an annealing step at a temperature ranging from 550° C. to 580° C.

12. The process as recited in claim 7, wherein said hemispherical grained silicon is made up of grains that are approximately 500 angstroms to 1000 angstroms in size and are spaced approximately 0.1 microns to 0.5 microns apart from the center of each said grain.

13. A process for forming a thin film transistor for a semiconductor device, said process comprising the steps of:

forming an insulation layer on a substrate;

forming a first amorphous silicon layer on said insulation layer;

forming silicon nucleation sites on said first amorphous silicon layer;

converting said first amorphous silicon layer into hemispherical grained silicon, said hemispherical grained silicon being formed about said silicon nucleation sites;

forming a second amorphous silicon layer covering said hemispherical grained silicon;

annealing said second amorphous silicon layer to convert said second amorphous silicon layer into a grained silicon film, said grained silicon film being formed about said hemispherical grained silicon;

patterning an oxide layer into a transistor gate oxide, thus leaving uncovered sections of said grained silicon film on opposing sides of said transistor gate oxide;

conductively doping said uncovered sections of said grained silicon film;

forming a patterned metal gate on said transistor gate oxide.

14. The process as recited in claim 13, wherein said step of forming said hemispherical grained silicon comprises presenting a silicon-based gas to said semiconductor assembly at a temperature of 500° C. to 550° C.

15. The process as recited in claim 14, wherein said silicon-based gas is a gas selected from the group consisting of $SiH_4$ and $SiH_6$.

16. The process as recited in claim 13, wherein said step of forming said first amorphous silicon layer comprises depositing an amorphous silicon layer having a thickness of 500 angstroms at a temperature ranging from 500° C. to 550° C.

17. The process as recited in claim 13, wherein said step of converting said second amorphous silicon layer into a grained silicon film comprises subjecting said second amorphous silicon layer to an annealing step at a temperature ranging from 550° C. to 580° C.

18. The process as recited in claim 13, wherein said silicon nucleation sites are made up of silicon deposits that are approximately 200 angstroms or less in size and are spaced approximately 0.1 microns to 0.5 microns apart.

* * * * *